(12) United States Patent
Nendorf et al.

(10) Patent No.: US 10,878,144 B2
(45) Date of Patent: Dec. 29, 2020

(54) MULTI-PLATFORM MODEL PROCESSING AND EXECUTION MANAGEMENT ENGINE

(71) Applicant: Allstate Insurance Company, Northbrook, IL (US)

(72) Inventors: Robert Andrew Nendorf, Chicago, IL (US); Nilesh Malpekar, Lincolnshire, IL (US); Mark V. Slusar, Chicago, IL (US); Joseph Alan Kleinhenz, Bolingbrook, IL (US); Robert Andrew Kreek, Seattle, WA (US); Patrick O'Reilly, Belfast (GB)

(73) Assignee: Allstate Insurance Company, Northbrook, IL (US)

( * ) Notice: Subject to any disclaimer, the term of this patent is extended or adjusted under 35 U.S.C. 154(b) by 226 days.

(21) Appl. No.: 15/673,872

(22) Filed: Aug. 10, 2017

(65) Prior Publication Data

US 2019/0050505 A1 Feb. 14, 2019

(51) Int. Cl.
*G06F 30/20* (2020.01)
*G06F 9/46* (2006.01)

(52) U.S. Cl.
CPC ............... *G06F 30/20* (2020.01); *G06F 9/46* (2013.01)

(58) Field of Classification Search
CPC ............................... G06F 17/5009; G06F 9/46
USPC ............................................................ 703/6
See application file for complete search history.

(56) References Cited

U.S. PATENT DOCUMENTS

| | | | |
|---|---|---|---|
| 6,192,360 B1 | 2/2001 | Dumais et al. | |
| 6,369,811 B1 | 4/2002 | Graham et al. | |
| 6,658,395 B1 * | 12/2003 | Barnhill | G06K 9/6256 706/16 |
| 6,925,432 B2 | 8/2005 | Lee et al. | |
| 7,295,977 B2 | 11/2007 | Whitman et al. | |
| 7,792,353 B2 | 9/2010 | Forman et al. | |
| 8,019,763 B2 | 9/2011 | Wang et al. | |
| 8,589,140 B1 * | 11/2013 | Poulin | G06F 11/3457 463/42 |

(Continued)

FOREIGN PATENT DOCUMENTS

| | | |
|---|---|---|
| CN | 106709453 A | 5/2017 |
| CN | 110168579 A | 8/2019 |
| WO | 2019186198 A1 | 10/2019 |

OTHER PUBLICATIONS

Javier Esparza Peidro & Francesc Muñoz-Escoí, Towards the next Generation of Model Driven Cloud Platforms, Jan. 2011, p. 1-8. (Year: 2011).*

(Continued)

*Primary Examiner* — Justin C Mikowski
(74) *Attorney, Agent, or Firm* — Banner & Witcoff, Ltd.

(57) ABSTRACT

Systems and methods are disclosed for managing the processing and execution of models that may have been developed on a variety of platforms. A multi-model execution module specifying a sequence of models to be executed may be determined. A multi-platform model processing and execution management engine may execute the multi-model execution module internally, or outsource the execution to a distributed model execution orchestration engine. A model data monitoring and analysis engine may monitor the internal and/or distributed execution of the multi-model execution module, and may further transmit notifications to various computing systems.

18 Claims, 7 Drawing Sheets

(56) References Cited

U.S. PATENT DOCUMENTS

| | | | |
|---|---|---|---|
| 8,954,358 | B1 | 2/2015 | Zhang et al. |
| 9,235,442 | B2* | 1/2016 | Kampas .................. G06F 9/50 |
| 9,412,077 | B2 | 8/2016 | Cheng et al. |
| 9,491,187 | B2* | 11/2016 | Sridhara ............. H04L 63/1408 |
| 9,626,629 | B2 | 4/2017 | Vijayaraghavan et al. |
| 10,078,688 | B2 | 9/2018 | Kolotienko et al. |
| 10,303,978 | B1 | 5/2019 | Kang et al. |
| 2003/0154191 | A1 | 8/2003 | Fish et al. |
| 2006/0149693 | A1 | 7/2006 | Otsuka et al. |
| 2007/0083365 | A1 | 4/2007 | Shmunk |
| 2012/0130771 | A1 | 5/2012 | Kannan et al. |
| 2012/0239739 | A1* | 9/2012 | Manglik ............... G06F 9/5077 709/203 |
| 2013/0097103 | A1 | 4/2013 | Chari et al. |
| 2013/0097706 | A1* | 4/2013 | Titonis ................. G06N 20/00 726/24 |
| 2015/0161386 | A1* | 6/2015 | Gupta ................ G06F 11/3612 726/23 |
| 2015/0220311 | A1* | 8/2015 | Salter ...................... G06F 8/34 717/105 |
| 2015/0356462 | A1* | 12/2015 | Fawaz .................. G06N 5/043 706/12 |
| 2016/0132787 | A1 | 5/2016 | Drevo et al. |
| 2017/0185898 | A1* | 6/2017 | Paul ....................... G06N 20/00 |
| 2017/0193360 | A1 | 7/2017 | Gao et al. |
| 2019/0140994 | A1 | 5/2019 | Snider et al. |
| 2019/0347668 | A1 | 11/2019 | Williams et al. |

OTHER PUBLICATIONS

Stefan Kolb and Guido Wirtz, Towards Application Portability in Platform as a Service, 2014 IEEE 8th International Symposium on Service Oriented System Engineering, p. 218-229. (Year: 2014).*

Elias Adriano Nogueira da Silva and Daniel Lucrédio, Towards a model-driven approach for promoting Cloud PaaS Portability, 2013 XXXIX Latin American Computing Conference (CLEI), p. 1-9. (Year: 2013).*

Hamdaqa M., Livogiannis T. and Tahvildari L., A Reference Model for Developing Cloud Applications. In Proceedings of the 1st International Conference on Cloud Computing and Services Science, 2011, p. 98-103. (Year: 2011).*

Sharma, Ritu & Sood, Manu & Sharma, Divya. (Jul. 2011). Modeling Cloud SaaS with SOA and MDA. p. 1-8. (Year: 2011).*

Petcu, Dana & Craciun, Ciprian & Rak, Massimiliano. (Jan. 2011). Towards a Cross Platform Cloud API—Components for Cloud Federation . . . Closer 2011—Proceedings of the 1st International Conference on Cloud Computing and Services Science. 166-169. (Year: 2011).*

Jan. 30, 2018—(WO) International Search Report—PCT/US17/63277.

Nicolas Loeff et al., Unlabeled Data Improves Word Prediction, Proceedings of the IEEE International Conference on Computer Vision, 956-962. 10.1109/ICCV.2009.5459347, 2009.

Jean-Noël Vittaut et al., Learning Classification with Both Labeled and Unlabeled Data, T. Elomaa et al. (Eds.): ECML, LNAI 2430, pp. 468-479, 2002, © Springer-Verlag Berlin Heidelberg 2002.

Xiuming Liu et al., Reliable Semi-Supervised Learning when Labels are Missing at Random, arXiv:1811.10947v5 [stat.ML] Oct. 24, 2019.

Sathya Madhusudhanan et al., Incremental Learning for Classification of Unstructured Data Using Extreme Learning Machine, Algorithms 2018, 11, 158; doi:10.3390/a11100158.

* cited by examiner

MULTI-PLATFORM MODEL PROCESSING AND EXECUTION MANAGEMENT ENGINE

TECHNICAL FIELD

Aspects of the disclosure generally relate to computing systems directed to the processing of multi-platform models and management of execution of these models.

BACKGROUND

Platforms for development and execution of models are known. However, the capabilities of these platforms to provide a multi-platform modeling environment in which models can be executed locally and/or on distributed systems are insufficient.

SUMMARY

The following presents a simplified summary in order to provide a basic understanding of some aspects of the disclosure. The summary is not an extensive overview of the disclosure. It is neither intended to identify key or critical elements of the disclosure nor to delineate the scope of the disclosure. The following summary merely presents some concepts of the disclosure in a simplified form as a prelude to the description below.

Aspects of the disclosure relate to systems, methods, and computing devices configured to manage the processing and execution of models that may have been developed on a variety of platforms. A multi-model execution module specifying a sequence of models to be executed may be determined. A multi-platform model processing and execution management engine may execute the multi-model execution module internally, or outsource the execution to a distributed model execution orchestration engine. A model data monitoring and analysis engine may monitor the internal and/or distributed execution of the multi-model execution module, and may further transmit notifications to various computing systems.

Other features and advantages of the disclosure will be apparent from the additional description provided herein.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION

In the following description of the various embodiments, reference is made to the accompanying drawings, which form a part hereof, and in which is shown by way of illustration, various embodiments of the disclosure that may be practiced. It is to be understood that other embodiments may be utilized.

Figure 1:
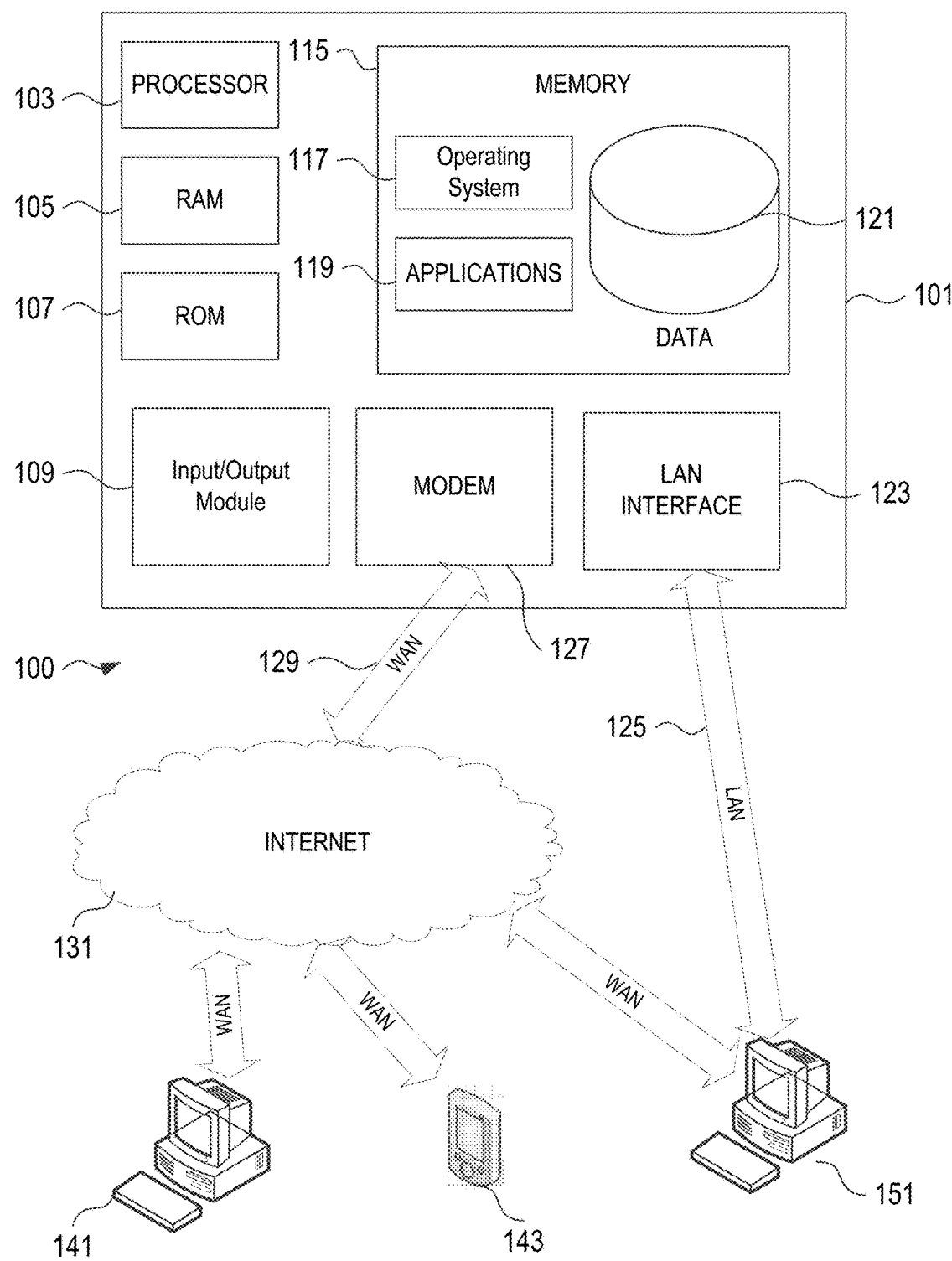
FIG. 1 illustrates one example operating environment in which one or more aspects described herein may be implemented.

As mentioned above, aspects of the disclosure relate to systems, devices, computer-implemented methods, and computer-readable media for managing the processing and execution of models that may have been developed on a variety of platforms. FIG. 1 illustrates an example of a suitable computing system 100 that may be used according to one or more illustrative embodiments. The computing system 100 is only one example of a suitable computing environment and is not intended to suggest any limitation as to the scope of use or functionality contained in the disclosure. The computing system 100 should not be interpreted as having any dependency or requirement relating to any one or combination of components shown in the illustrative computing system 100.

The disclosure is operational with numerous other special purpose computing systems or configurations. Examples of computing systems, environments, and/or configurations that may be suitable for use with the disclosed embodiments include, but are not limited to, personal computers (PCs), server computers, hand-held or laptop devices, mobile devices, tablets, multiprocessor systems, microprocessor-based systems, set-top boxes, programmable consumer electronics, network PCs, minicomputers, mainframe computers, distributed computing environments that include any of the above systems or devices, and the like and are configured to perform the functions described herein. The mobile devices, for example, may have virtual displays or keyboards.

With reference to FIG. 1, the computing system 100 may include a computing device (e.g., server 101) wherein the processes discussed herein may be implemented. The server 101 may have a processor 103 for controlling the overall operation of the server 101 and its associated components, including random-access memory (RAM) 105, read-only memory (ROM) 107, input/output module 109, and memory 115. Processor 103 and its associated components may allow the server 101 to receive one or models from one or more platforms, process these models to generate standardized models, receive one or more multi-model execution modules utilizing one or more of the standardized models, and execute the multi-model execution module locally or outsource the multi-model execution module to a distributed model execution orchestration engine.

Server 101 may include a variety of computer-readable media. Computer-readable media may be any available media that may be accessed by server 101 and include both volatile and non-volatile media, removable and non-removable media. For example, computer-readable media may comprise a combination of computer storage media and communication media.

Computer storage media include volatile and non-volatile, removable and non-removable media implemented in any method or technology for storage of information such as computer-readable instructions, data structures, program modules, or other data. Computer storage media include, but are not limited to, random access memory (RAM), read only memory (ROM), electronically erasable programmable read only memory (EEPROM), flash memory or other memory technology, CD-ROM, digital versatile disks (DVD) or other optical disk storage, magnetic cassettes, magnetic tape, magnetic disk storage or other magnetic storage devices, or any other medium that can be used to store the desired information that can be accessed by server 101.

Computing system 100 may also include optical scanners (not shown). Exemplary usages include scanning and converting paper documents, such as correspondence, data, and the like to digital files.

Although not shown, RAM 105 may include one or more applications representing the application data stored in RAM 105 while the server 101 is on and corresponding software applications (e.g., software tasks) are running on the server 101.

Input/output module 109 may include a microphone, keypad, touch screen, and/or stylus through which a customer of server 101 may provide input, and may also include one or more of a speaker for providing audio output and a video display device for providing textual, audiovisual and/or graphical output.

Software may be stored within memory 115 and/or storage to provide instructions to processor 103 for enabling server 101 to perform various functions. For example, memory 115 may store software used by the server 101, such as an operating system 117, application programs 119, and an associated database 121. Also, some or all of the computer executable instructions for server 101 may be embodied in hardware or firmware.

Server 101 may operate in a networked environment supporting connections to one or more remote computing devices, such as computing devices 141, 143, and 151. The computing devices 141, 143, and 151 may be personal computing devices or servers that include many or all of the elements described above relative to the server 101. The computing devices 141, 143, 151 may be a mobile computing devices or servers that include many or all of the elements described above relative to server 101.

The network connections depicted in FIG. 1 include a local area network (LAN) 125 and a wide area network (WAN) 129, but may also include other networks. When used in a LAN networking environment, server 101 may be connected to the LAN 125 through a network interface (e.g., LAN interface 123) or adapter in the communications module 109. When used in a WAN networking environment, the server 101 may include a modem 127 or other means for establishing communications over the WAN 129, such as the Internet 131 or other type of computer network. It will be appreciated that the network connections shown are illustrative and other means of establishing a communications link between the computing devices may be used. Various well-known protocols such as TCP/IP, Ethernet, FTP, HTTP and the like may be used, and the system may be operated in a client-server configuration to permit a customer to retrieve web pages from a web-based server. Any of various conventional web browsers may be used to display and manipulate on web pages.

Additionally, one or more application programs 119 used by the server 101, according to an illustrative embodiment, may include computer executable instructions for invoking functionality related to communication including, for example, email short message service (SMS), and voice input and speech recognition applications.

Embodiments of the disclosure may include forms of computer-readable media. Computer-readable media include any available media that can be accessed by a server 101. Computer-readable media may comprise storage media and communication media and in some examples may be non-transitory. Storage media include volatile and nonvolatile, removable and non-removable media implemented in any method or technology for storage of information such as computer-readable instructions, object code, data structures, program modules, or other data. Communication media include any information delivery media and typically embody data in a modulated data signal such as a carrier wave or other transport mechanism.

Memory 115 may also store data 121 used in performance of one or more aspects of this disclosure. For example, data 121 may include received from modeling platforms, post-processed standardized models, multi-model execution modules, data sets for the multi-model execution modules, and results from execution of the multi-model execution modules.

Various aspects described herein may be embodied as a method, a data processing system, or as a computer-readable medium storing computer-executable instructions. For example, a computer-readable medium storing instructions to cause a processor to perform steps of a method in accordance with aspects of the disclosed embodiments is contemplated. For instance, aspects of the method steps disclosed herein may be executed on a processor 103 on server 101. Such a processor may execute computer-executable instructions stored on a computer-readable medium.

Figure 2:
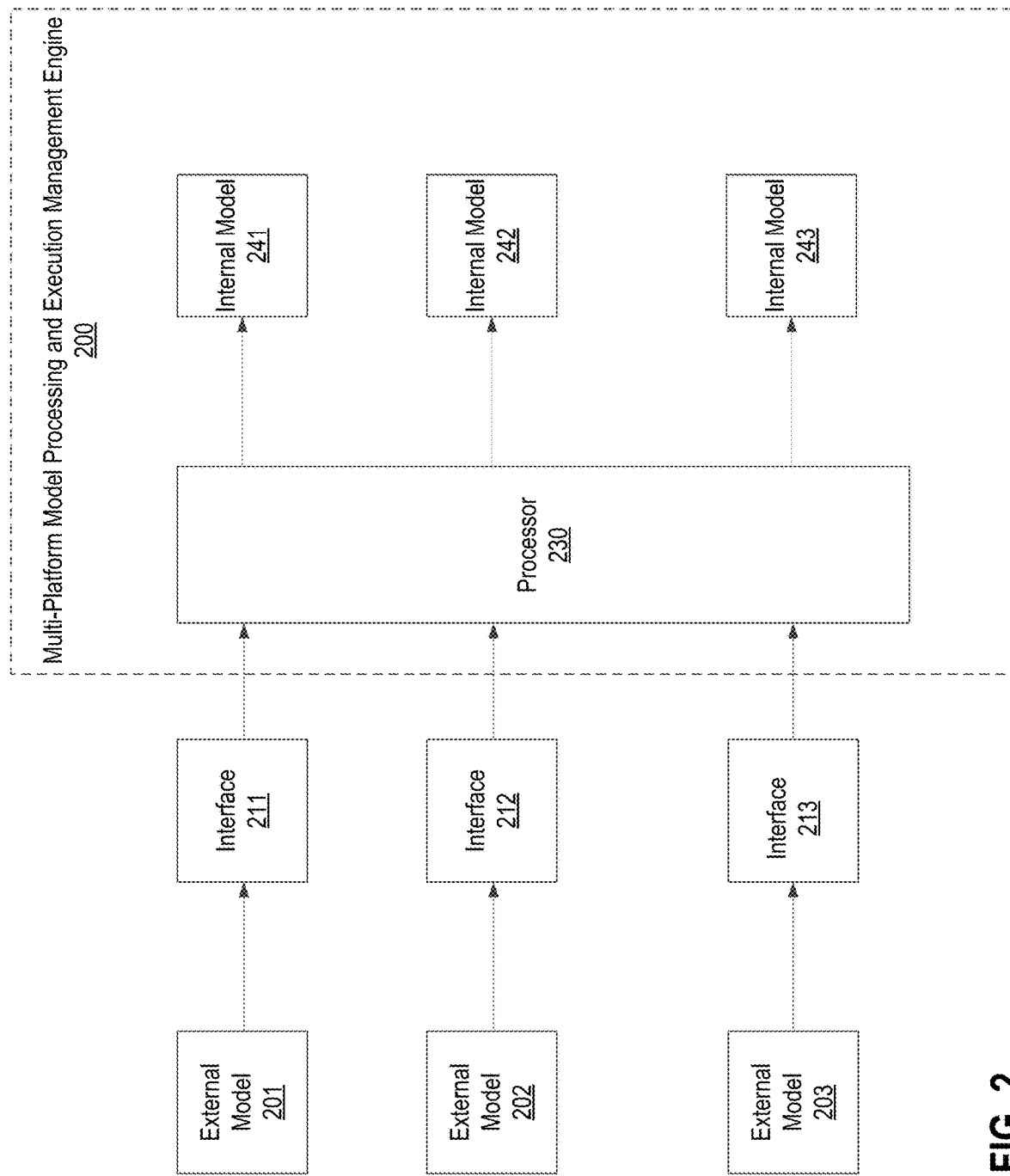
FIG. 2 illustrates an example of a multi-platform model processing and execution management engine that may be used according to one or more illustrative embodiments.

FIG. 2 illustrates an example of a multi-platform model processing and execution management engine 200 that may be used according to one or more illustrative embodiments. Multi-platform model processing and execution management engine 200 may include a processor 230. Processor 230 may be configured to receive data from one or more interfaces. The data received from these interfaces may comprise models that have been developed on different modeling platforms. For example, processor 230 may receive a first external model 201 via interface 211, a second external model 202 via interface 212, and/or a third external model 203 via interface 213. Each of first external model 201, second external model 202, and third external model 203 may have been developed on different modeling platforms. For example, these different modeling platforms may include frameworks in R such as glm, glmnet, gbm, xgboost, frameworks in Python such as scikitlearn and xgboost, and standalone tools, such as H2O. Additionally, each of interface 211, interface 212, and interface 213 may be different types of interfaces. For example, interface 211 may be a graphical user interface that may be accessed via a web service. In another example, interface 212 may be an application programmable interface (API) in R, Python, Java, PHP, Ruby, or scala, and/or the like. In yet another example, the interface may be a command line interface (CLI) executed in the shell.

Upon receiving an external model from an interface, processor 230 may be configured to process the model to generate an internal model. Continuing with the example above, processor 230 may process first external model 201 to generate first internal model 241, process second external model 202 to generate internal model 242, and process third external model 203 to generate internal model 243. Each of these internal models may be in a standard format such that these internal models may be executed by multi-platform model processing and execution management engine 200, or outsourced for execution by multi-platform model processing and execution management engine 200. Processing of these external models may include translating the model from an external language to an internal language. Processing may additionally or alternatively include verifying that the internal models are functional. For example, calls to the internal model from a computing device may be simulated via processor 230.

In an alternative environment, one or more converters may be utilized to convert the external models to internal models. For example, one or more converters may be located external to multi-platform model processing and execution management engine 200. These one or more converters may receive the external models 201, 202, and 203 from interfaces 211, 212, and 213, respectively. Additionally, or alternatively, the one or more converters may receive the external models 201, 202, and 203 directly from the modeling engines in which the external models were generated. The one or more converters may process external models 201, 202, and 203 to generate internal models 241, 242, and 243, respectively. In one instance, each modeling framework may have its own dedicated converter (or converters). For example, a first converter may be utilized to transform an external model, that was created within the Python modeling framework, to an internal framework used by multi-platform model processing and execution management engine 200, such as JSON. Similarly, a second converter may be utilized to transform an external model that was created within the R modeling framework to an internal framework used by multi-platform model processing and execution management engine 200 (such as JSON). The one or more converters may then transmit internal models 241, 242, and 243 to processor 230 of multi-platform model processing and execution management engine 200.

Once the internal models are generated and/or received from external converters, these models may be stored within one or more storage devices of multi-platform model processing and execution management engine 200. One or more of the internal models may additionally or alternatively be stored on external storage devices. The internal models may be modified on an as-needed basis. Processor 230 may be configured to generate and transmit notifications to one or more computing devices subsequent to generation of an internal model. These notifications may indicate that the processing of the corresponding external model is complete. These notifications may additionally include information about and access to the internal model.

As discussed below in reference to FIG. 3, one or more multi-model execution modules may be created, each of which may include calls to one or more internal models. In addition to receiving external models created via various modeling platforms, multi-platform model processing and execution management engine 200 may outsource the execution of these multi-model execution modules to various model execution environments. For example, a first multi-model execution module may be deployed on a mobile device, while a second multi-model execution module may be deployed on a cluster/cloud environment, such as Hadoop.

Figure 3:
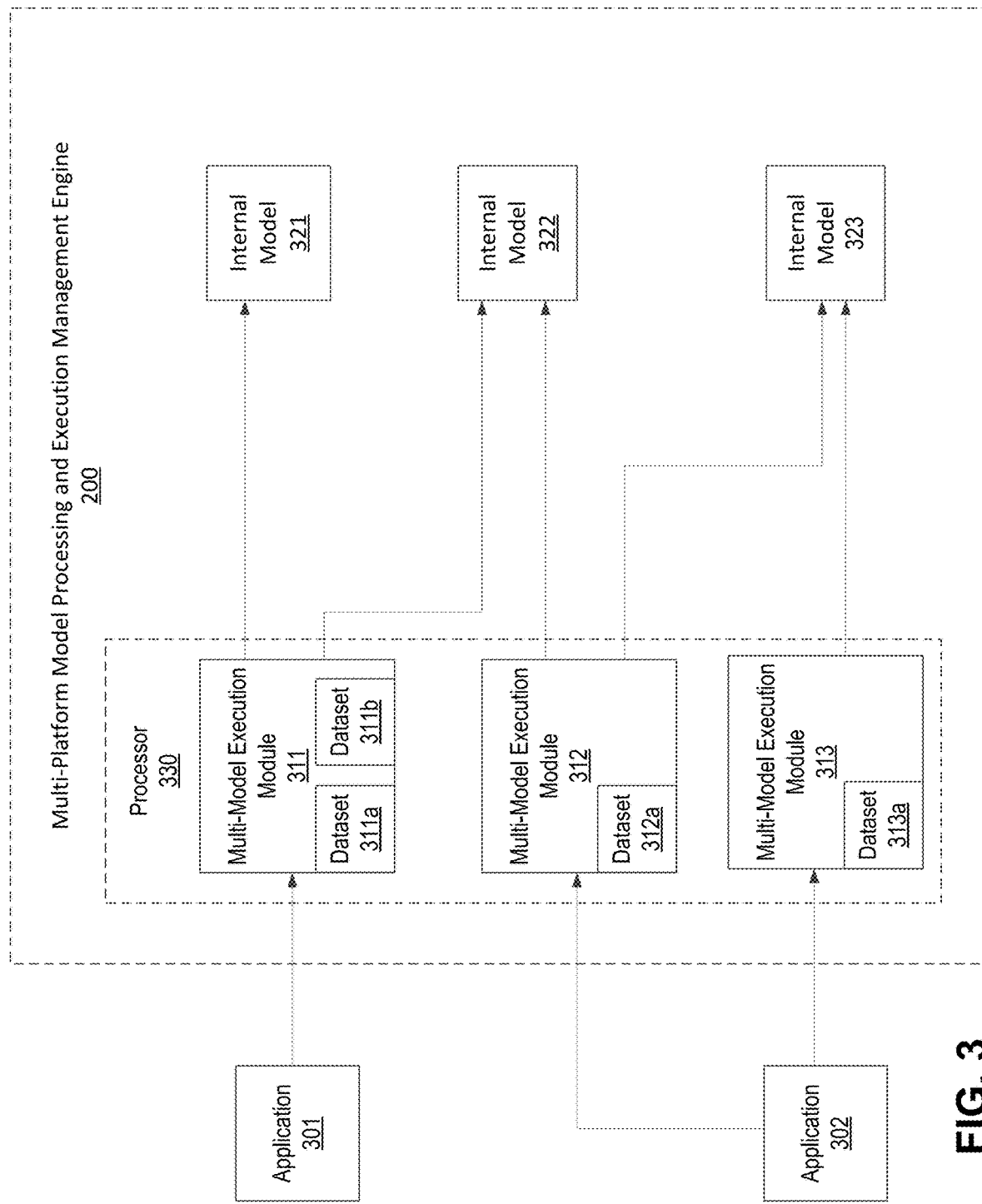
FIG. 3 illustrates additional example aspects of a multi-platform model processing and execution management engine that may be used according to one or more illustrative embodiments.

FIG. 3 illustrates additional example aspects of a multi-platform model processing and execution management engine 200 that may be used according to one or more illustrative embodiments. Processor 330, internal model 321, internal model 322, and internal model 323, shown in FIG. 3, may correspond to processor 230, internal model 241, internal model 242, and internal model 243, shown in FIG. 2, respectively. Application 301 and application 302 may each be executing on computing devices external to multi-platform model processing and execution management engine 200. Application 301 and application 302 may each communicate with processor 330 via one or more interfaces (not shown).

The applications may communicate with processor 330 to create one or more multi-model execution modules. For example, application 301 may create and configure multi-model execution module 311. Application 302 may communicate with processor 330 to create and configure multi-model execution module 312 and multi-model execution module 313. Each multi-model execution module may comprise one or more datasets and calls to one or more internal models. For example, multi-model execution module 311 may include dataset 311*a* and dataset 311*b*, and may include calls to both internal model 321 and internal model 322. In another example, multi-model execution module 312 may include dataset 312*a* and may include calls to both internal model 322 and internal model 323. In yet another example, multi-model execution module 313 may include dataset 313*a* and may include a call to internal model 323.

A many-to-many relationship may exist between the applications and the internal models. That is, a single application (for example, application 302) may create multiple multi-model execution modules that result in calls to many different models, and each internal model (for example, internal model 322) may be called by many applications via the various multi-model execution modules created by these applications. Each of the applications may use the different internal models differently and with different inputs. Certain applications may utilize one or more internal models on a daily basis, whereas other applications may utilize those one or more internal models on a less-frequent basis (i.e., weekly, bi-weekly, monthly, etc.). In another application, certain applications may utilize one or more internal models for batch jobs (i.e., running the internal models multiple times using multiple sets of data), whereas other applications may utilize those one or more internal models in a one-time use case.

A multi-model execution module may include a sequence of calls to various internal models. The sequence of calls may be pre-configured by the application associated with the multi-model execution module. Alternatively, the sequence of calls may be dynamically determined during the execution of the multi-model execution module (discussed in detail below in reference to FIG. 5). Each call to an internal model within the multi-model execution module may be associated with a different dataset. For example, in multi-model execution module 311, the call to internal model 321 may be associated with dataset 311*a*, and the call to internal model 322 may be associated with dataset 311*b*. The datasets may be stored within the multi-model execution module, processor 330, a storage device internal to multi-platform model processing and execution management engine 200, an external storage device, and/or on a cloud-based storage device. The calls to the internal models may include the actual datasets themselves, or may alternatively include information identifying the location of the datasets. In the case of the latter, the dataset may be retrieved from its location during the execution of the internal model. In one instance, one or more of the datasets may be created and propagated with data during the configuration of the multi-model execution module. In another instance, one or more of the datasets may be dynamically created and/or propagated with data during the execution of the multi-model execution module. Processor 330 may execute multiple multi-model execution modules simultaneously.

In one instance, a multi-model execution module may be configured to be executed locally by processor 330. For example, application 301 may create and configure multi-model execution module 311 on processor 330. Once the configuration of multi-model execution module 311 is complete, multi-model execution module 311 may be locally executed by processor 330. Execution of multi-model execution module 311 locally by processor 330 may include one or more local calls from processor 330 to internal models. For example, during execution of multi-model execution module 311, processor 330 may call internal model 321. Processor 330 may transmit dataset 311a to internal model 321 as part of the call to the internal model 321. Alternatively, processor 330 may transmit instructions to internal model 321 to access dataset 311 as needed during the execution of internal model 321. Dataset 311a may include data to be utilized by internal model 321 during execution of internal model 321. Internal model 321 may store the results of the execution to dataset 311a. These results may also be transmitted from internal model 321 to processor 330 (where they may be stored), or to another internal model.

Once execution of internal model 321 is complete, and the results have been received by multi-model execution module 311 (and/or stored in dataset 311a), processor 330 may call internal model 322. Alternatively, internal model 321 may be configured by multi-model execution module 311 to call internal model 322 once execution of internal model 321 is complete. The call to internal model 322 may include dataset 311b. Dataset 311b may include data that is to be used in the execution of internal model 322. In one example, a portion of the data in dataset 311b may be output data generated by execution of one or more additional internal models. Internal model 322 may store the results of the execution of internal model 322 to dataset 311b. These results may also be transmitted from internal model to processor 330 (where they may be stored), or to another internal model. Once execution of internal model 322 is complete, and the results have been received by multi-model execution module 311 (and/or stored in dataset 311a), processor 330 may call one or more additional models as specified within multi-model execution module 311. If no additional internal models are to be called, processor 330 may aggregate the results of multi-model execution module 311 (i.e., the data produced by the execution of the internal models). Processor 330 may then transmit a notification to application 301 (or the corresponding computing device) indicating that execution of multi-model execution module 311 is complete. Additionally, or alternatively, processor 330 may transmit the aggregated results of the execution of multi-model execution module 311 to the corresponding computing device. In one instance, processor 330 may process the aggregated results data prior to transmitting the data to the corresponding computing device. Processor 330 may be configured to similarly locally execute multi-model execution module 312 and/or multi-model execution module 313.

As noted above, in other instances, processor 330 may be configured to outsource the execution of one or more multi-model execution modules. For example, processor 330 may be configured to outsource the execution of multi-model execution module 312 to a distributed model execution orchestration engine (discussed below in reference to FIG. 5).

Figure 4:
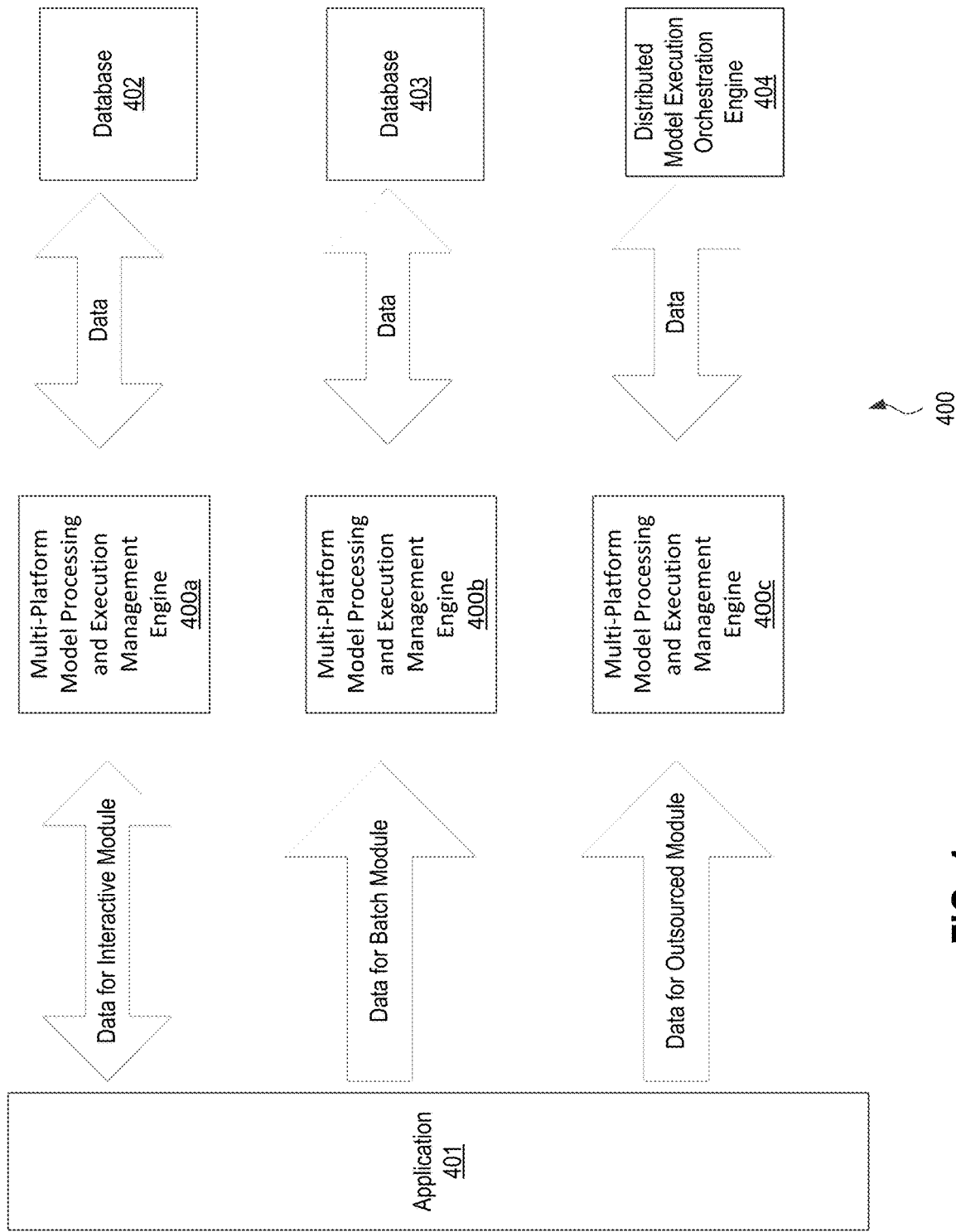
FIG. 4 illustrates an example environment including multiple multi-platform model processing and execution management engines.

FIG. 4 illustrates computing environment 400 comprising a plurality of multi-platform model processing and execution management engines. Each of multi-platform model processing and execution management engine 400a, multi-platform model processing and execution management engine 400b, and multi-platform model processing and execution management engine 400c may be an instantiation of multi-platform model processing and execution management engines 200. Application 401 may be an instantiation of application 301 or 302. Although only one application is shown for purposes of illustratively clarity, multiple applications be present in environment 400 (for example, as shown in FIG. 3).

Application 401 may create one or more multi-model execution modules on each of multi-platform model processing and execution management engine 400a, multi-platform model processing and execution management engine 400b, and multi-platform model processing and execution management engine 400b. As discussed above in reference to FIG. 3, creation of the multi-model execution modules may include the transmittal of data between application 401 and the multi-platform model processing and execution management engines.

In a first instance, application 401 may create a first multi-model execution module on multi-platform model processing and execution management engine 400a. The first multi-model execution module may be an interactive multi-model execution module. In this instance, application 401 may transmit data (or location of data) needed for the creation of the first multi-model execution module to multi-platform model processing and execution management engine 400a, and may further transmit data (or the location of data) needed for the execution of the first multi-model execution module. For example, application 401 may transmit, to multi-platform model processing and execution management engine 400a, one or more datasets that are to be utilized during execution of the first multi-model execution module on multi-platform model processing and execution management engine 400a. Once the first multi-model execution module has been created on multi-platform model processing and execution management engine 400a, multi-platform model processing and execution management engine 400a may initiate execution of the first multi-model execution module. To execute the first multi-model execution module, multi-platform model processing and execution management engine 400a may utilize datasets that have been transmitted from application 401. Additionally, or alternatively, multi-platform model processing and execution management engine 400a may utilize datasets that are stored on external storage devices, such as database 402. Execution of the first multi-model execution module may include calls to one or more internal models. Instantiations of these one or more internal models may also be stored on external storage devices, such as database 402. Accordingly, during execution of the first multi-model execution module, multi-platform model processing and execution management engine 400a may transmit data to (such as datasets to be utilized as inputs for one or more internal models), and may receive data from (such as internal model data) the external storage devices. Once execution of the first multi-model execution module is complete, multi-platform model processing and execution management engine 400a may transmit the results of the execution of the first multi-model execution module to application 401.

In one variation of the first instance, application 401 may create and store the first multi-model execution module on an external storage device, such as database 402. Application 401 may then transmit execution instructions to the multi-platform model processing and execution management engine 400a. The execution instructions may include instructions that trigger multi-platform model processing and execution management engine 400a to retrieve the first multi-model execution module from the external storage device, and to execute the first multi-model execution module. Again, once execution of the first multi-model execution module is complete, multi-platform model processing and execution management engine 400a may transmit the results of the execution of the first multi-model execution module to application 401.

In a second instance, application 401 may create a second multi-model execution module on multi-platform model processing and execution management engine 400b. The second multi-model execution module may be a batch multi-model execution module. Batch multi-model execution modules may include multiple executions of a same sequence of internal models. Each execution of the sequence of internal models may utilize different datasets. In this instance, application 401 may transmit data (or location of data) needed for the creation of the first multi-model execution module to multi-platform model processing and execution management engine 400b, and may further transmit the location of the datasets needed for the execution of the second multi-model execution module. In one example, a first execution of the sequence of internal models may require a first set of datasets, and a second execution of the sequence of internal models may require a second set of datasets (the first and second execution are for illustrative purposes only, and execution of the batch multi-model execution module may include thousands of executions of the sequence of internal models). The datasets of the first set of datasets and the second set of datasets may be stored on different external storage devices. The locations of each of these datasets may be transmitted from application 401 during creation of the second multi-model execution module. As previously noted, execution of the second multi-model execution module may include thousands of executions of a same sequence of internal models, each of the executions utilizing different datasets. As each execution of the sequence of internal models is completed, multi-platform model processing and execution management engine 400b may store the results of that execution on external storage devices, such as database 403. The particular external storage devices to be utilized for storage may be specified within the second multi-model execution module, or may be dynamically determined by multi-platform model processing and execution management engine 400b. The results of different executions of the sequence of internal models may be stored on the same external storage device, or may be stored on different external storage devices. Multi-platform model processing and execution management engine 400b may tag the results so that the results identify the particular dataset(s) used during the execution of the sequence of internal models.

In a third instance, application 401 may create a third multi-model execution module on multi-platform model processing and execution management engine 400c. The third multi-model execution module may be an outsourced multi-model execution module. In this instance, application 401 may transmit data (or location of data) needed for the creation of the third multi-model execution module to multi-platform model processing and execution management engine 400c, and may further transmit data (or the location of data) needed for the execution of the third multi-model execution module to multi-platform model processing and execution management engine 400c. For example, application 401 may transmit, to multi-platform model processing and execution management engine 400c, the location of one or more datasets that are to be utilized during execution of the third multi-model execution module. Once the third multi-model execution module has been created on multi-platform model processing and execution management engine 400c, multi-platform model processing and execution management engine 400c may outsource execution of the third multi-model execution module to distributed model execution orchestration engine 420c. This is discussed in detail below in reference to FIG. 5.

Figure 5:
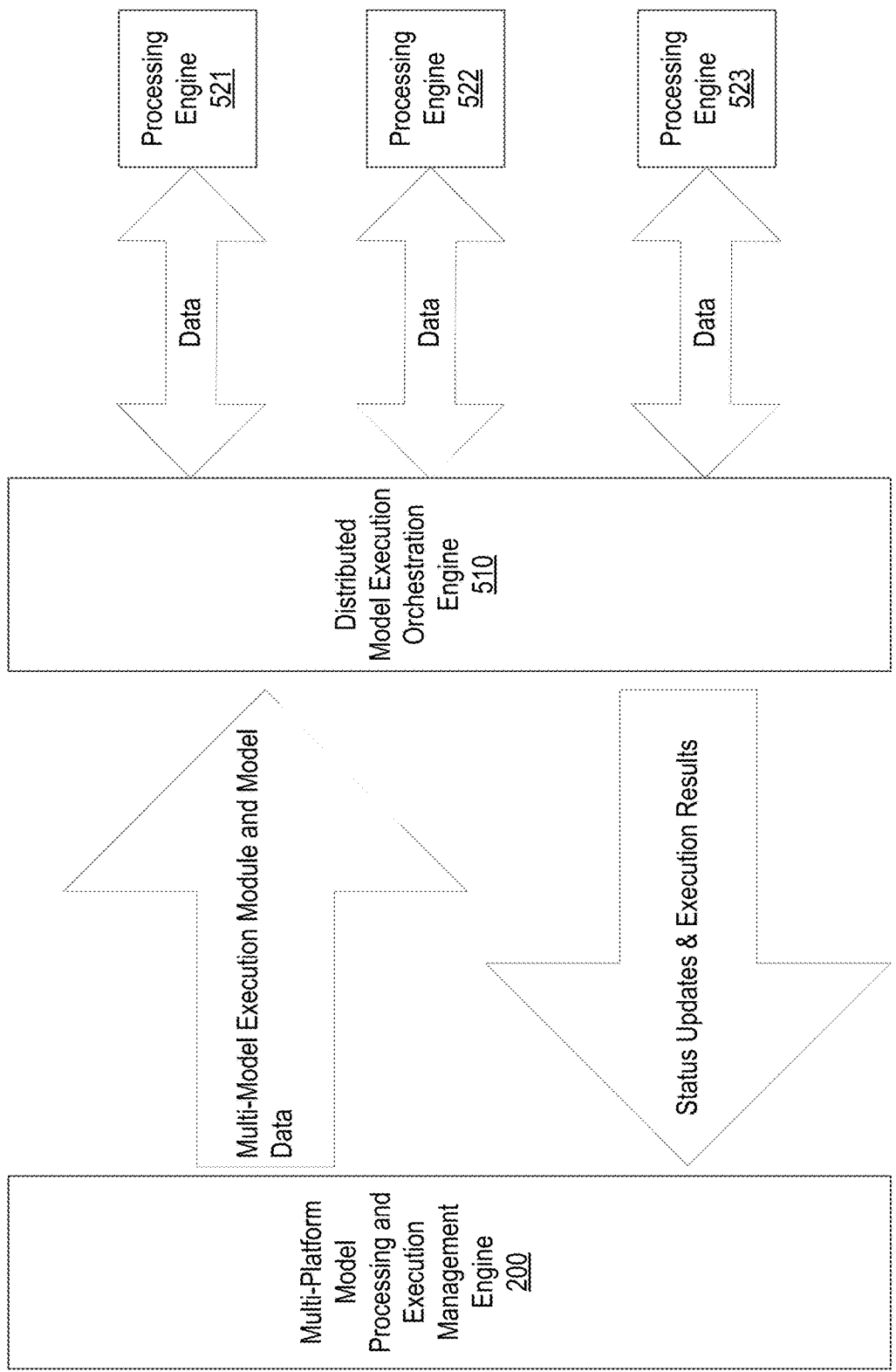
FIG. 5 illustrates an example distributed execution environment for a multi-model execution module.

FIG. 5 illustrates an example environment for an outsourced execution of a multi-model execution module. Multi-platform model processing and execution management engine 200 may be configured to transmit multi-model execution module data (and corresponding datasets) and internal model data to the distributed model execution orchestration engine 510. Transmittal of the multi-model execution module data may comprise transmittal of the multi-model execution module, a portion of the multi-model execution module, or information identifying a location of the multi-model execution module. Transmittal of the multi-model execution module data may further include transmittal of one or more datasets of the multi-model execution module, and/or information identifying locations of the one or more datasets of the datasets. Transmittal of the internal model data may comprise transmittal of one or more internal models, portions of one or more internal models, and/or information identifying the location of one or more internal models.

Distributed model execution orchestration engine 510 may be configured to receive the multi-model execution module and internal model data from multi-platform model processing and execution management engine 200. Distributed model execution orchestration engine 510 may further be configured to orchestrate execution of the multi-model execution module across a plurality of distributed processing engines, such as processing engine 521, processing engine 522, and/or processing engine 523. One or more of the execution and orchestration features discussed below may be performed by a controller located on distributed model execution orchestration engine 150 and associated with the multi-platform model processing and execution management engine. Distributed model execution orchestration engine may distribute the execution of the multi-model execution module based on a plurality of different factors, such as processing capabilities of the various processing engines, locations of the datasets needed for the internal models, and/or availabilities of the various processing engines. For example, the execution of the multi-model execution module may require calls to three internal models. A first dataset needed for a first internal model of the three internal models may be located on processing engine 521. Accordingly, distributed model execution orchestration engine 510 may transmit data to processing engine 521, wherein the data may include instructions to execute the first internal model using data stored on processing engine 521. The data transmitted to processing engine 521 may include the first internal model, or information identifying a location of the first internal model. A second dataset needed for a second internal model of the three internal models may be located on processing engine 522. Accordingly, distributed model execution orchestration engine 510 may transmit data to processing engine 522, wherein the data may include instructions to execute the second internal model using data stored on processing engine 522. The data transmitted to processing engine 522 may include the second internal model, or information identifying a location of the second internal model. A third dataset needed for a third internal model of the three internal models may be located on processing engine 523. Accordingly, distributed model execution orchestration engine 510 may transmit data to processing engine 523, wherein the data may include instructions to execute the third internal model using data stored on processing engine 523. The data transmitted to processing engine 523 may include the third internal model, or information identifying a location of the third internal model.

The processing engines may intermittently return status updates to distributed model execution orchestration engine 510. In turn, distributed model execution orchestration engine 510 may intermittently forward these status updates to multi-platform model processing and execution management engine 200. The processing engines may further transmit results of the execution of the internal models to distributed model execution orchestration engine 510. In one instance, distributed model execution orchestration engine 510 may forward these results to multi-platform model processing and execution management engine 200 as they are transmitted to distributed model execution orchestration engine 510. In another instance, distributed model execution orchestration engine 510 may wait and aggregate all the results from the various processing engines, and then transmit the aggregated results to multi-platform model processing and execution management engine 200. As discussed above in reference to FIG. 3, multi-platform model processing and execution management engine 200 may transmit these results to one or more external computing devices.

Figure 6:
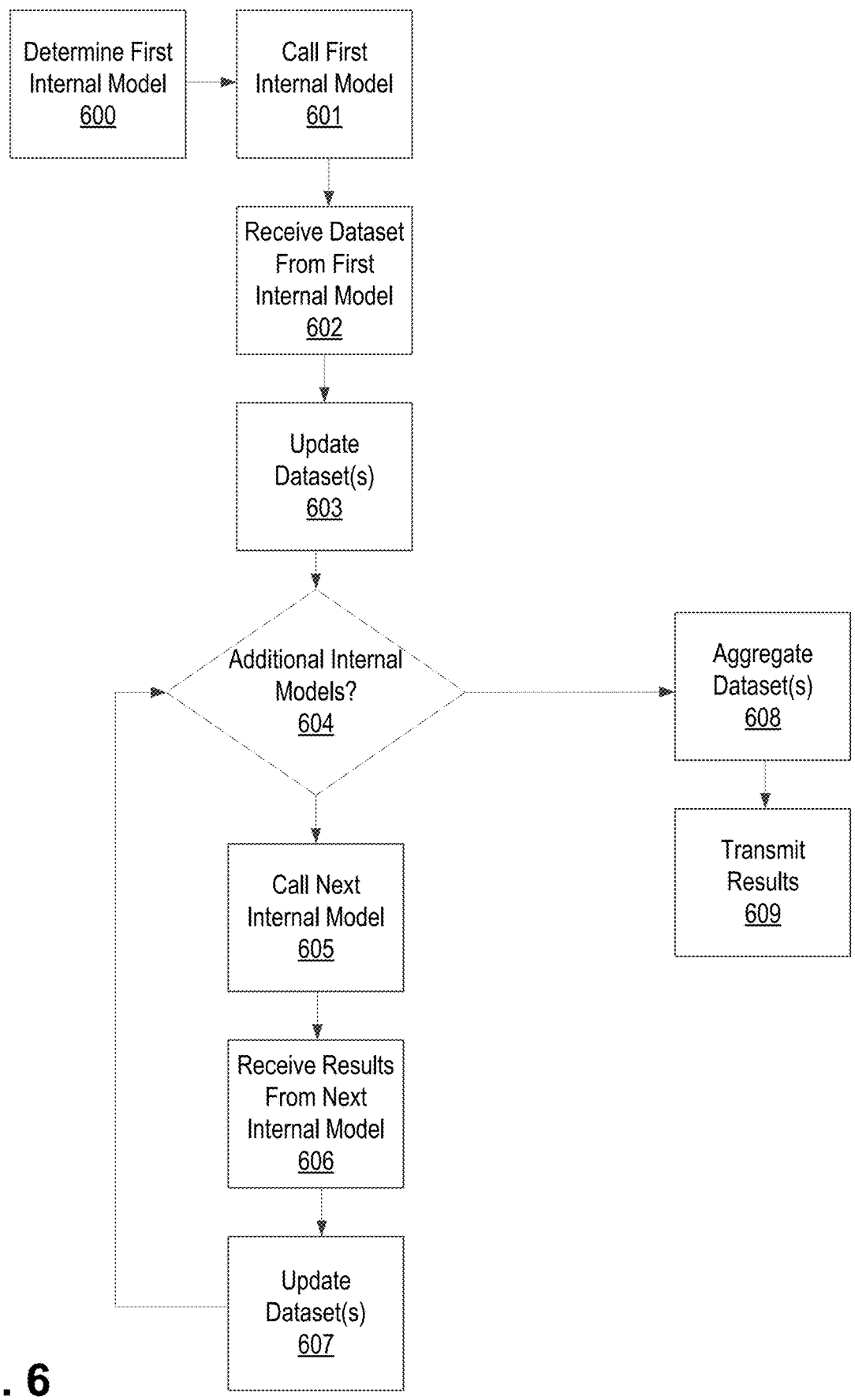
FIG. 6 illustrates an example sequence of steps that may be executed by a processor of a multi-platform model processing and execution management engine during execution of a multi-model execution module.

FIG. 6 illustrates an example sequence of steps that may be executed by a processor (for example, processor 230) of multi-platform model processing and execution management engine 200 during execution of a multi-model execution module. As discussed above in reference to FIG. 2, a multi-model execution module may comprise a series of calls to different internal models. Each of the calls may be associated with a dataset that is to be utilized by a particular internal model when it is called. Each of the calls may further result in the generation of new output data, resulting from the execution of the corresponding internal model.

At step 600, the processor may determine the first internal model to be called. The first internal model to be called may be identified within the multi-model execution module. The processor may then retrieve the dataset that is to be used by the first internal model during its execution. In one instance, the dataset may already be stored within the multi-model execution module. In another instance, the multi-model execution module may identify the location of the dataset, and the processor may retrieve the dataset from the identified location.

At step 601, the processor may call the first internal model. Calling the first internal model may comprise transmitting data to the first internal model. The data may include an instruction and a dataset, wherein the instruction indicates that the first internal model is to execute using the transmitted dataset. The instructions may further indicate that the dataset output from the first internal model is to be transmitted to the processor. Calling the first internal model may trigger the execution of the first internal model. At step 602, the processor may receive a dataset output from the first internal model. In one instance, the first internal model may transmit the dataset itself to the processor. In another instance, the first internal model may transmit the location of the dataset to the processor, and the processor may retrieve the dataset from the location.

At step 603, the processor may update one or more downstream datasets based on the dataset received from the first internal model. As noted above, the multi-model execution module may comprise a sequence of calls to various internal models. In certain instances, a dataset output by a first internal model during execution of the multi-model execution module (or a portion thereof) may be used as input data for a subsequent internal model during execution of the multi-model execution module. In these instances, when the processor receives the dataset from the first internal model, the processor may determine whether the dataset (or a portion thereof) is to be used during any subsequent calls of the multi-model execution module. If so, the processor may propagate these downstream input datasets with data from the dataset returned by the first internal model.

At step 604, the processor may determine if additional internal models are to be called during execution of the multi-model execution module. In one instance, the multi-model execution module may indicate that no additional internal models are to be called. In another instance, the multi-model execution module may indicate the internal model that is to be called next. In another instance, the multi-model execution module may indicate that the determination of whether or not another internal model to be called (and the identity of that internal model) is to be dynamically determined based on the dataset returned by the first internal model. In this instance, the processor may analyze the dataset returned by the first internal model and automatically determine which internal model, if any, is to be called next. For example, the processor may compare one or more values of the dataset to one or more threshold values, and select the next internal model based on a result of the comparison. In one instance, the processor may compare a first value of the dataset to a first threshold value. If the first value of the dataset is above the first threshold value, the processor may automatically determine that a second internal model is to be called as the next internal model; if the first value of the dataset is below the first threshold value, the processor may automatically determine that a third internal model is to be called as the next internal model. If, at step 604, the processor determines (based on an explicit indication in the multi-model execution module or an analysis of the dataset returned by the first internal model) that a particular internal model is to be called next, the processor may proceed to step 605.

At step 605, the processor may call the next internal model. Similar to calling the first internal model, calling the next internal model may comprise transmitting data to the next internal model. The data may include an instruction and a dataset, wherein the instruction indicates that the next internal model is to execute using the transmitted dataset. The instructions may further indicate that the dataset output from the next internal model is to be transmitted to the processor. Calling the next internal model may trigger the execution of the next internal model. At step 606, the processor may receive a dataset output from the next internal model. In one instance, the next internal model may transmit the dataset itself to the processor. In another instance, the next internal model may transmit the location of the dataset to the processor, and the processor may retrieve the dataset from the location. At step 607, the processor may update one or more downstream datasets based on the dataset received from the next internal model. The processor may then return to step 604, where the processor may determine whether additional internal models are to be called during execution of the multi-model execution module.

If, at step 604, the processor determines that no additional internal models are to be called, the processor may proceed to step 608. At step 608, the processor may aggregate each of the datasets returned from the internal models called during execution of the multi-model execution module. In certain instances, the multi-model execution module may specify that only a subset of the aggregated data is to be stored as the final output data. In these instances, the multi-model execution module may process the aggregated data to filter out the unnecessary data. At step 609, the processor may send the results of the execution of the multi-model execution module to one or more computing devices. The results may comprise all or a subset of the aggregated data.

Figure 7:
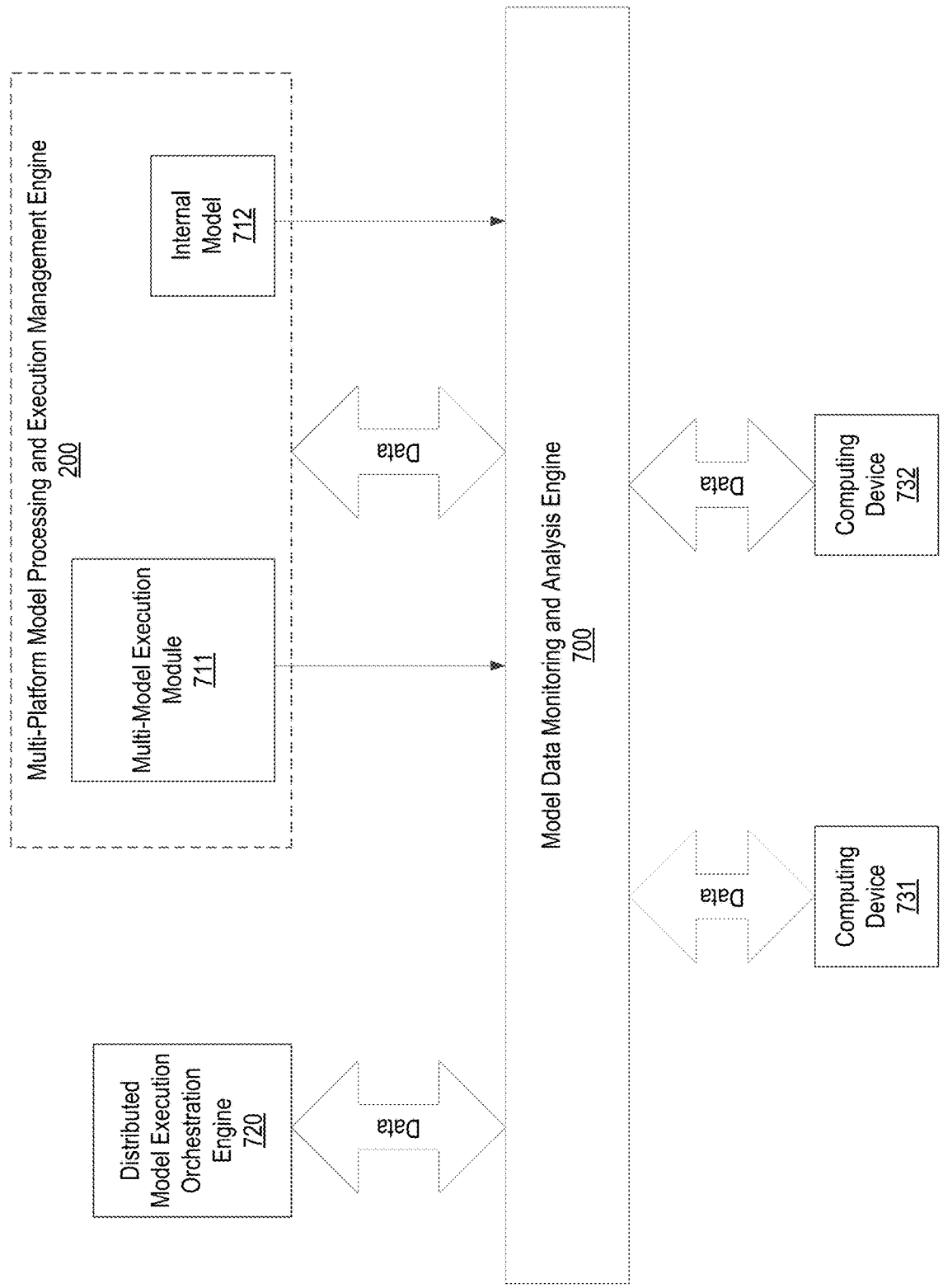
FIG. 7 illustrates an example operating environment of a multi-platform model processing and execution management engine.

FIG. 7 illustrates an example operating environment of a multi-platform model processing and execution management engine. Multi-model execution module 711, internal model 712, and distributed model execution orchestration engine 720 may correspond to multi-model execution module 311, internal model 321, and distributed model execution orchestration engine 410, respectively. One or more elements of multi-platform model processing and execution management engine 200 may transmit data to and/or receive data from model data monitoring and analysis engine 700. For example, multi-model execution module 711 and/or internal model 712 may transmit data to or receive data from model data monitoring and analysis engine 700. In another example, a processor (not shown) within multi-platform model processing and execution management engine 200 may transmit data to or receive data from model data monitoring and analysis engine 700. Additionally, distributed model execution orchestration engine 720 and model data monitoring and analysis engine 700 may be configured to exchange data.

Model data monitoring and analysis engine 700 may be configured to monitor data generated within multi-platform model processing and execution management engine 200. One or more computing systems, such as computing system 731 and/or computer system 732, may be utilized to configure model data monitoring and analysis engine 700.

For example, as discussed above in reference to FIGS. 2 and 3, multi-model execution module 711 may receive data from one or more internal models. Multi-model execution module 711 may be configured to transmit the data received from internal models to model data monitoring and analysis engine 700. Additionally, or alternatively, model data monitoring and analysis engine 700 may be configured to periodically transmit requests for data to multi-model execution module 711. The periodic requests may be automatically transmitted by model data monitoring and analysis engine 700, and may be sent every few seconds, every minute, every hour, daily, weekly, and/or the like. The particular intervals at which the requests from model data monitoring and analysis engine 700 are to be automatically transmitted may be configured by computing systems, such as computing system 731 and/or computer system 732. In response, multi-model execution module 711 may transmit any new data received from internal models (i.e., since a last request for data was received from model data monitoring and analysis engine 700) to model data monitoring and analysis engine 700. Additionally or alternatively, a similar exchange of data may occur between model data monitoring and analysis engine 700 and one or more internal models of multi-platform model processing and execution management engine 200, such as internal model 712. As discussed above with respect to FIGS. 2 and 3, the execution of internal models may result in a generation of one or more datasets. The internal models may be configured to transmit the generated datasets to model data monitoring and analysis engine 700. Additionally or alternatively, model data monitoring and analysis engine 700 may be configured to periodically transmit requests for data to internal model 712. In response, internal model 712 may transmit any new generated datasets (i.e., since a last request for data was received from model data monitoring and analysis engine 700) to model data monitoring and analysis engine 700.

As discussed above in reference to FIG. 3, distributed model execution orchestration engine 720 may be configured to receive output data from one or more processing engines that execute internal models. Distributed model execution orchestration engine 720 may be configured to transmit these datasets as they are received from the processing engines to model data monitoring and analysis engine 700. Additionally or alternatively, model data monitoring and analysis engine 700 may be configured to periodically transmit requests for data to distributed model execution orchestration engine 720. In response, distributed model execution orchestration engine 720 may transmit any new datasets received from the processing engines (i.e., since a last request for data was received from model data monitoring and analysis engine 700) to model data monitoring and analysis engine 700.

Model data monitoring and analysis engine 700 may be configured to aggregate and analyze the model data received from distributed model execution orchestration engine 720 and multi-platform model processing and execution management engine 200. The specific type(s) of analysis to be performed on the data may vary based on the source of data, the type of data, etc., and may be configured by external computing systems, such as computing system 731 and/or computer system 732. For example, computing system 731 may access model data monitoring and analysis engine 700 via one or more interfaces (not shown). Computing system 731 may create one or more analysis modules (not shown) within model data monitoring and analysis engine 700. Computing system 731 may create a first analysis module within model data monitoring and analysis engine 700. Computing system 731 may configure the first analysis module to periodically request model data from one or more sources. For example, computing system 731 may configure the first analysis module to request first model data from distributed model execution orchestration engine 720 at a first time interval, second model data from multi-model execution module 711 at a second time interval, and/or third model data from internal model 712 at a third time interval.

Computing device 731 may further configure the first analysis module to perform one or more analysis functions on the received model data. For example, computing device 731 may configure the first analysis module to perform stability analysis on the third model data received from internal model 712. The stability analysis may track the outputs of the internal model 712 over pre-determined time intervals, and determine whether the outputs are deviating from an expected output, or whether the outputs indicate that internal model 712 is degrading and requires updating. For example, internal model 712 may be forecasted to degrade at a first rate, and the stability analysis may include analyzing the output data to determine if the actual degradation of internal model 712 is tracking or exceeding the forecasted degradation of internal model 712. Computing device 731 may configure the first analysis module to send automatic alerts to computing device 731 (or another computing device). In one instance, computing device 731 may configure the first analysis module to send an automatic alert upon detection of an unexpected deviation of the outputs. Additionally or alternatively, computing device 731 may configure the first analysis module to send an automatic alert upon determining that the outputs have drifted beyond a specified value or range of values. For example, computing device 731 may configure the first analysis module to send an automatic alert upon determining that the outputs (or values produced during and/or as a result of analysis of the outputs) fall within (or outside) a predefined range of values, above a threshold, below a threshold, and the like.

In another example, computing device 732 may be configured to create a second analysis module within model data monitoring and analysis engine 700. Computing device 732 may configure the second analysis module to automatically retrieve all of the datasets of multi-model execution module 711. For example, multi-model execution module 711 may include calls to multiple internal models, and the second analysis module may be configured to retrieve each of the input datasets and output datasets of each of the multiple internal models. Computing device 732 may configure the second analysis module to perform a traceability analysis on these datasets. For example, the second analysis module may analyze each of these datasets to determine the effects of particular datasets and/or internal models on the final output of the multi-model execution module. For example, if the output of the multi-model execution module largely deviated from an expected output (or expected range of outputs), the second analysis module may analyze the datasets and internal models to determine which one of (or combination of) the datasets and internal models had a substantial effect on the output. The analysis may include re-running of the models using various what-if scenarios. For example, one or more input datasets may be changed, and the multi-model execution module (or a portion thereof) may be re-executed using the modified input datasets. This process may be repeated a number of times, until the second analysis module is able to identify the one or more factors driving the outlying output.

Additionally, or alternatively, computing device 732 may configure the second analysis module to automatically monitor and send alerts to computing device 732 (or another computing device) regarding the input datasets and output datasets. Regarding the output datasets, the second analysis module may be configured to automatically request the output datasets from multi-model execution module 711 via automated, periodic requests. Computing device 732 may configure the particular time periods at which different output datasets are to be requested from multi-model execution module 711 within the second analysis module. The analysis of the output datasets received from the multi-model execution module 711 may be similar to that discussed above with reference to the first analysis module. Further similar to the first analysis module, computing device 732 may configure the second analysis module to automatically send alerts to computing device 732 when the output values fall within or outside of a predetermined range of values, above a predefined threshold, below a predefined threshold, and/or the like.

Regarding the input datasets, computing device 732 may configure the second analysis module to automatically request the input datasets from multi-model execution module 711 via automated requests. The automated requests may be a one-off event, or may occur on a periodic basis. The computing device 732 may further configure the second analysis module to automatically analyze the input datasets received from the multi-model execution module 711. For example, the second analysis module may be configured to determine a current distribution of values of the input datasets. The second analysis module may further be configured to compare the current distribution of values to an older distribution of values determined from a prior input dataset received from multi-model execution module 711 (or from multi-platform model processing and execution management engine 200). The second analysis module may determine, based on the comparison, whether there was a significant shift in the distribution of values. For example, the second analysis module may determine if the change in distribution (i.e., the difference between the current distribution of values and the older distribution of values) is within a range of predefined values, above a predefined threshold, below a predefined threshold, etc. If there is a significant shift in the distribution of the values, the second analysis module may be configured to automatically send an alert indicating the shift to computing device 732 (or another computing device).

The analysis modules within the model data monitoring and analysis engine 700 may be executed as a one-time use case, or may be configured to execute periodically. The analysis modules may be configured to automatically transmit notifications and/or data to one or more computing systems. For example, the first analysis module may be configured to transmit data/notifications to computing system 731, and the second analysis module may be configured to transmit data/notifications to computing system 732. The specific data and/or notifications to be transmitted may be configured at the time the analysis modules are configured, and may additionally be dynamically modified on an as-needed basis. In one instance, an analysis module may be configured to transmit a notification upon detecting an unexpected output from an internal model and/or a multi-model execution module. The analysis module may additionally or alternatively be configured to transmit data reporting the results of an analysis. For example, the second analysis module may be configured to transmit data indicating the specific datasets and/or internal models that are substantially affecting the final output of the multi-model execution module. Additionally, the analysis modules may be configured to store all analysis results on one or more storage devices. These stored results may subsequently be used by the same or different analysis modules when performing automated analysis of data.

While the aspects described herein have been discussed with respect to specific examples including various modes of carrying out aspects of the disclosure, those skilled in the art will appreciate that there are numerous variations and permutations of the above described systems and techniques that fall within the spirit and scope of the invention.

What is claimed is:

1. An apparatus comprising:
   a processor; and
   memory storing computer-executable instructions that, when executed by the processor, cause the apparatus to:
   receive a first external machine learning model generated in a first modeling framework;
   receive a second external machine learning model generated in a second modeling framework distinct from the first modeling framework;
   generate a first machine learning model by processing the first external machine learning model, wherein the first machine learning model is formatted using a common modeling framework;
   generate a second machine learning model by processing the second external machine learning model, wherein the second machine learning model is formatted using the common modeling framework;
   transmit the first machine learning model to a mobile device;

trigger execution of the first machine learning model by the mobile device;
receive a dataset generated based on execution of the first machine learning model by the mobile device;
obtain a historical statistical distribution generated based on the dataset;
calculate a statistical distribution based on the dataset;
determine a shift in the distribution of values between the historical statistical distribution and the statistical distribution;
transmit a notification indicating the shift in distribution of values based on the shift exceeding a threshold value;
automatically determine, based on the dataset and the shift in distribution of values exceeding the threshold value, a second machine learning model for execution;
transmit, to a cloud computing device, the dataset;
trigger execution of the second machine learning model by the cloud computing device, wherein the execution of the second machine learning model is based on the dataset;
obtain a second dataset from the cloud computing device, wherein the second dataset is generated based on the execution of the second machine learning model; and
generate an aggregated dataset based on the dataset and the second dataset.

2. The apparatus of claim 1, the memory storing computer-executable instructions that, when executed by processor, further cause the apparatus to:
identify a location of a first dataset to be used as input data by the first machine learning model;
retrieve the first dataset from the location; and
transmit the first dataset to the mobile device, wherein the dataset obtained from the mobile device is generated based on the first dataset.

3. The apparatus of claim 1, wherein the first modeling framework is the same as the common modeling framework.

4. The apparatus of claim 1, the memory storing computer-executable instructions that, when executed by processor, further cause the apparatus to:
determine that a portion of the dataset is to be used as input by one or more additional machine learning models; and
responsive to the determination that the portion of the dataset is to be used as input by the one or more additional machine learning models, update at least one dataset associated with the one or more additional machine learning models with the portion of the dataset.

5. The apparatus of claim 1, wherein the instructions, when executed by processor, further cause the apparatus to transmit the aggregated dataset to the mobile device.

6. The apparatus of claim 1, wherein the instructions, when executed by processor, further cause the apparatus to store the dataset in one or more external storage devices.

7. A method comprising:
obtaining, by a computing device, a first external machine learning model generated in a first modeling framework;
obtaining, by the computing device, a second external machine learning model generated in a second modeling framework distinct from the first modeling framework;
generating, by the computing device, a first machine learning model by processing the first external machine learning model, wherein the first machine learning model is formatted using a common modeling framework;
generating, by the computing device, a second machine learning model by processing the second external machine learning model, wherein the second machine learning model is formatted using the common modeling framework;
transmitting, by the computing device and to a mobile device, the first model;
triggering, by the computing device, execution of the first machine learning model by the mobile device;
receiving, by the computing device and from the mobile device, a dataset generated based on execution of the first machine learning model by the mobile device;
obtaining, by the computing device, a historical statistical distribution generated based on the dataset;
calculating, by the computing device, a statistical distribution based on the dataset;
determining, by the computing device, a shift in the distribution of values between the historical statistical distribution and the statistical distribution;
transmitting, by the computing device, a notification indicating the shift in distribution of values based on the shift exceeding a threshold value;
automatically determining, by the computing device and based on the dataset and the shift in distribution of values exceeding the threshold value, a second machine learning model for execution;
transmitting, by the computing device, the dataset to a cloud computing device;
triggering, by the computing device, execution of the second machine learning model by the cloud computing device, wherein the execution of the second machine learning model is based on the dataset;
obtaining, by the computing device, a second dataset from the cloud computing device, wherein the second dataset is generated based on the execution of the second machine learning model; and
generating, by the computing device, an aggregated dataset based on the dataset and the second dataset.

8. The method of claim 7, further comprising:
identifying, by the computing device, a location of a first dataset to be used as input data by the first machine learning model;
retrieving, by the computing device, the first dataset from the location; and
transmitting, by the computing device, the first dataset to the mobile device, wherein the dataset obtained from the mobile device is generated based on the first dataset.

9. The method of claim 7, further comprising:
receiving, by the computing device, a first external machine learning model generated in a first modeling framework;
receiving, by the computing device, a second external machine learning model generated in a second modeling framework distinct from the first modeling framework;
generating, by the computing device, the first machine learning model by processing the first external machine learning model, wherein the first machine learning model is formatted using the first modeling framework; and
generating, by the computing device, the second machine learning model by processing the second external machine learning model, wherein the second machine learning model is formatted using the first modeling framework.

10. The method of claim 7, further comprising:
determining, by the computing device, that a portion of the dataset is to be used as input by one or more additional machine learning models; and
based on the determining, updating, by the computing device, at least one dataset associated with the one or more additional machine learning model with the portion of the dataset.

11. The method of claim 7, further comprising transmitting, by the computing device, the aggregated dataset to the mobile device.

12. The method of claim 7, further comprising storing, by the computing device, the dataset in one or more external storage devices.

13. A non-transitory computer readable medium storing instructions that, when executed by one or more processors, cause the one or more processors to perform steps comprising:
obtaining a first external machine learning model generated in a first modeling framework;
obtaining a second external machine learning model generated in a second modeling framework distinct from the first modeling framework;
generating a first machine learning model by processing the first external machine learning model, wherein the first machine learning model is formatted using a common modeling framework;
generating a second machine learning model by processing the second external machine learning model, wherein the second machine learning model is formatted using the common modeling framework;
transmitting the first machine learning model to a mobile device;
triggering execution of the first machine learning model by the mobile device;
receiving a dataset from the mobile device, wherein the dataset is based on execution of the first machine learning model by the mobile device;
obtaining a historical statistical distribution generated based on the dataset;
calculating a statistical distribution based on the dataset;
determining a shift in the distribution of values between the historical statistical distribution and the statistical distribution;
transmitting a notification indicating the shift in distribution of values based on the shift exceeding a threshold value;
automatically determining, based on the dataset and the shift in distribution of values exceeding the threshold value, a second machine learning model for execution;
transmitting the dataset to a cloud computing device;
triggering execution of the second machine learning model by the cloud computing device, wherein the execution of the second machine learning model is based on the dataset;
obtaining a second dataset from the cloud computing device, wherein the second dataset is generated based on the execution of the second machine learning model; and
generating an aggregated dataset based on the dataset and the second dataset.

14. The non-transitory computer readable medium of claim 13, further storing instructions that, when executed by one or more processors, cause the one or more processors to perform steps comprising:
identifying a location of a first dataset to be used as input data by the first machine learning model;
retrieving the first dataset from the location; and
transmitting the first dataset to the mobile device, wherein the results obtained from the mobile device are generated based on the first dataset.

15. The non-transitory computer readable medium of claim 13, wherein the first modeling framework is the same as the common modeling framework.

16. The non-transitory computer readable medium of claim 13, further storing instructions that, when executed by the one or more processors, cause the one or more processors to perform steps comprising:
determining that a portion of the dataset is to be used as input by one or more additional machine learning models; and
based on the determining, updating at least one dataset associated with the one or more additional machine learning model with the portion of the dataset.

17. The non-transitory computer readable medium of claim 13, wherein the instructions that, when executed by the one or more processors, cause the one or more processors to perform steps comprising transmitting the aggregated dataset to the mobile device.

18. The apparatus of claim 1, wherein the instructions, when executed by the processor, further cause the apparatus to:
automatically determine, based on the second dataset, a third machine learning model for execution;
transmit, to the cloud computing device, the second dataset;
trigger execution of the third machine learning model by the cloud computing device, wherein the execution of the third machine learning model is based on the second dataset;
obtain a third dataset from the cloud computing device, wherein the third dataset is generated based on the execution of the third machine learning model; and
generate the aggregated dataset further based on the third dataset.

* * * * *